(12) United States Patent
Pas

(10) Patent No.: US 6,285,180 B1
(45) Date of Patent: Sep. 4, 2001

(54) PROBE ADAPTER AND HOLDER

(75) Inventor: Alexander Julian Pas, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/173,042

(22) Filed: Oct. 15, 1998

(51) Int. Cl.[7] .................................................. G01R 31/02
(52) U.S. Cl. ........................ 324/72.5; 324/754; 324/758
(58) Field of Search ................................... 324/72.5, 758, 324/754; 269/88, 147, 152, 253; 408/88

(56) References Cited

U.S. PATENT DOCUMENTS

| | | | |
|---|---|---|---|
| 3,458,687 | * 7/1969 | Cranch | 219/521 |
| 3,500,192 | * 3/1970 | Donaher et al. | 324/72.5 |
| 5,984,287 | * 11/1999 | Fitzsimmons | 269/17 |

* cited by examiner

*Primary Examiner*—Safet Metjahic
*Assistant Examiner*—E P LeRoux
(74) *Attorney, Agent, or Firm*—Andrea P. Bryant; Leslie A. Van Leeuwen

(57) ABSTRACT

Apparatus is provided for precisely positioning and thereafter holding a probe connected to an oscilloscope or the like. The apparatus enables a single operator to position the probe and read and adjust the oscilloscope. The apparatus has a rod like means about which a nonconducting probe holder enjoys several degrees of freedom. The rod is connected to a weighted base by a clamp through which the rod may slide as part the gross positioning of the assembly and which clamp can be adjusted to finely position the rod and probe clamp assembly.

6 Claims, 2 Drawing Sheets

PROBE ADAPTER AND HOLDER

TECHNICAL FIELD

The present invention relates to electrical testing of printed circuit boards. More particularly, it relates to using a hand held tool such as a probe connected to an oscilloscope or other device to perform signal analysis.

BACKGROUND OF THE INVENTION

Hand held probes are used in characterizing electrical contacts and leads on printed circuit boards. The reliability of results depends oftentimes on the steadiness of the probe user's hands. As printed circuitry becomes denser and more complex, it is increasingly difficult to accurately place and hold a probe in proper alignment during testing. Failure to maintain a probe in proper position for readout leads to the need for repetition and becomes costly in terms of both time and human resources.

It is important to assure integrity of readings as components and leads become smaller. Accurately placing and securely holding a probe in proper alignment reduces the need for repetition and thereby reduces costs associated with testing. A problem sometimes arises when the hands of one operator are not adequate to the tasks of both holding a probe and making real time adjustments to the oscilloscope. An operator is forced into awkward positions and may lose his or her steadiness of grip while trying to view and adjust the oscilloscope. Multiple operators become involved in obtaining a single reading. One must try to hold the probe steady while another tends to oscilloscope adjustments.

It is, therefore, desirable to enable a single operator to reliably place a probe and hold it steady while viewing and adjusting an oscilloscope.

BRIEF SUMMARY OF THE INVENTION

The present invention overcomes the problems noted above in connection with hand held probes by providing apparatus adapted for precise positional adjustment for holding a probe steady during testing of printed circuit boards or the like so that a single operator may both position the probe as well as view and adjust an oscilloscope, or the like, to which the probe is attached.

The apparatus of the present invention comprises a free standing structure including a movable arm to which is connected a cradle for securely holding a probe. The cradle is relatively movable with respect to the arm and the whole may be finely adjusted for maintaining the probe in a precise position selected by the probe user. Once the probe is properly positioned the operator may conclude the test operation with no need to handle the probe until a new test site is to be probed.

BRIEF DESCRIPTION OF THE DRAWINGS

The above and other features and advantages of the present invention be described in detail having reference to the following drawing wherein like reference numerals are used throughout for the same elements and wherein.

DETAILED DESCRIPTION OF THE PREFERRED EMBODIMENT

Figure 1:
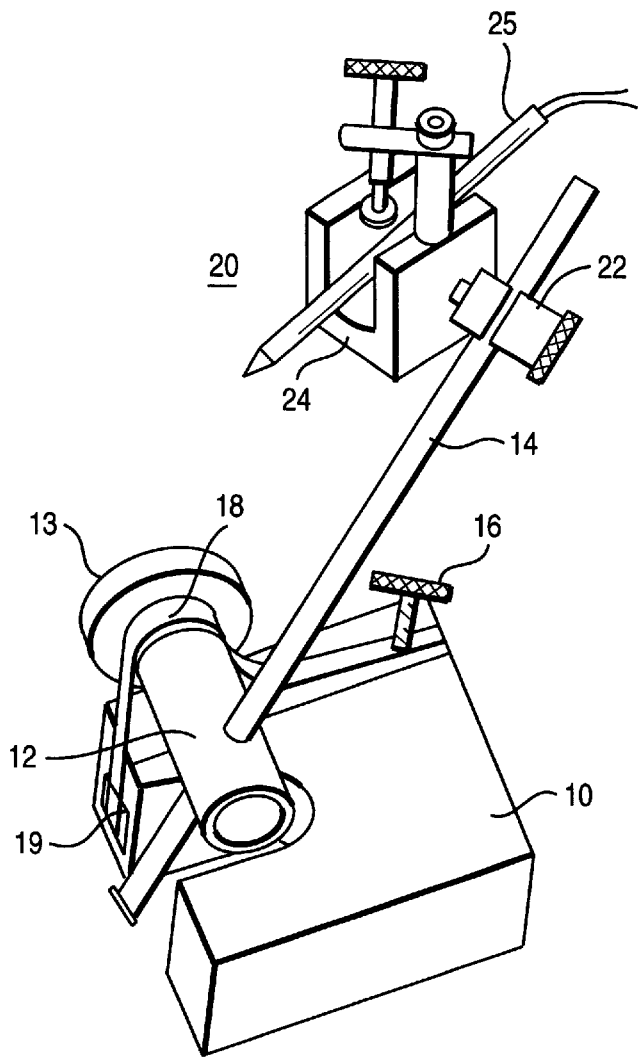
FIG. 1 is a perspective view of a preferred embodiment of the inventive apparatus.

Refer now to FIG. 1 which shows a preferred embodiment of the probe holder assembly mounted on base 10. A swivel clamp 12 is mounted on base 10 and includes an adjustment screw 13. Extension arm or rod 14 is linearly movable within clamp 12. Clamp 12 is able to clasp rod 14 anywhere along its length. Turning adjustment screw 13 of clamp 12 makes rod 14 swivel around the linear axis of screw 13 for grossly positioning rod 14. Fine adjustment of the vertical position of rod 14 is made by turning knob 16 which adjusts the angle at which rod 14 is held in clamp 12. This level of fine adjustment is made in a well understood manner by causing pivoting rocker arm 18 to move toward or away, within a limited range from spring 19.

Probe holder 20 comprises two connected functional components, clamp 22 and probe clamp 24. An electronic oscilloscope probe 25 is shown phantom in FIG. 1. Probe holder 20 clamp 22 is slidably positionable along rod 14 and may be fixed at any desired angular position around rod 14. That is, the entire probe holder 20 assembly is free to move linearly along rod 14 and may also be locked at any angular position with respect to rod 14. Probe clamp 24 of probe holder 20 is made from non conducting material. Probe clamp 24 may be moved rotationally with respect portion 22, as will be described below.

Figure 2:
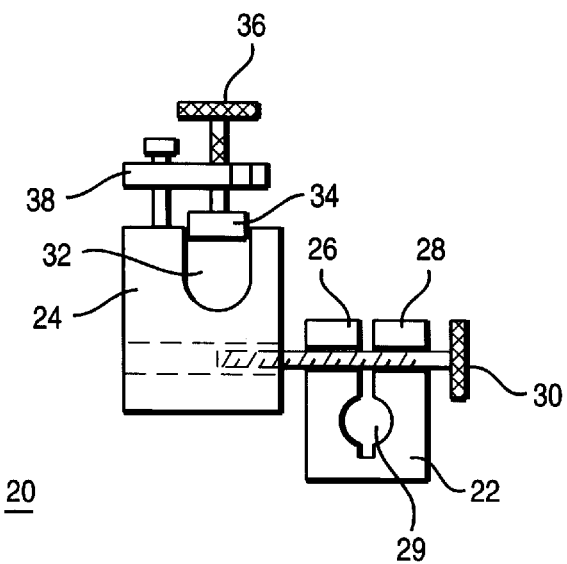
FIG. 2 shows probe holder 20 in greater detail.

Refer now to FIG. 2 which shows probe holder 20 assembly in greater detail. Clamp 22 includes a U shaped opening with side portions 26 and 28 which are moved relative to each other by turning knob 30 once rod 14 is placed therein in the opening 29. Knob 30 is one end of a screw threaded through clamps 22 and 24. Clamp 24 may be rotated to any desired position prior to being locked by tightening screw 30. Further, clamp 24 may be separated from probe holder assembly 20 and reversed prior to being again threaded on screw 30. That is, clamp 24 is threaded through and may accept screw 30 from either side. In this manner, probe holder assembly 20 becomes universally adjustable.

As noted above, for safety reasons and to ensure integrity of readings, that clamp 24 of probe holder 20 which accepts a probe is made of electrically non conductive material. The body of a typical oscilloscope probe is fixedly held in opening 32 in clamp 24 of probe holder 20 so that there is no slippage as clamp 22 of probe holder 20 is positioned angularly around or slidably along rod 14, prior to being locked.

When a probe is placed in opening 32 it is securely maintained therein by lowering pad 34 through the downward movement caused by screw 36 through bracket 38. While clamp 24 is shown having a substantially cubical configuration, this configuration is for illustrative purposes only. A more cylindrical shape may be used in either FIG. 2 or in the modification shown on FIGS. 3A and 3B.

Figure 3A:
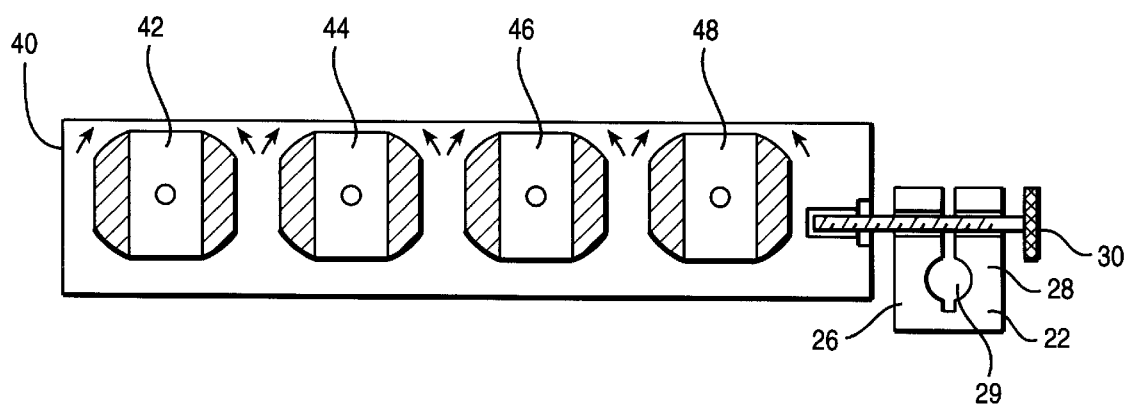
FIGS. 3A and 3B illustrate a modification of the invention.
Figure 3B:
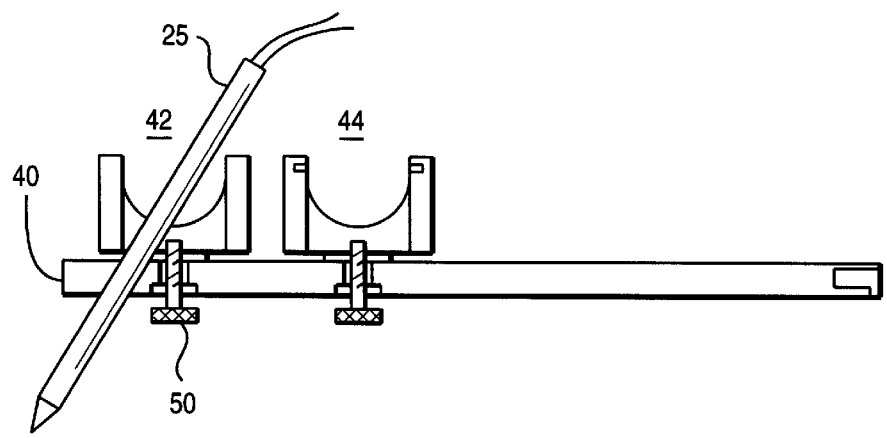

FIGS. 3A and 3B illustrate a modification to the present invention. FIG. 3A illustrates a top view of an embodiment in which rather than a single probe holder 20, a probe holding member 40, having probe holders 42, 44, 46, and 48 is provided. Member 40 is adapted for attachment to rod 14 by means of clamp 22 and screw 30. Spacing between the individual probe holders is chosen as a function of the dimensions of the articles to be probed.

FIG. 3B is a side view of FIG. 3A with screw 30 not shown. Only two probe holders are shown in this view for illustrative purposes only. Obviously, a user may choose the number of probes to use. Each probe holder assembly 42, 44 is constructed substantially as clamp 24 is shown in FIG. 2, but the top of the holders containing parts equivalent to pad 34, downward tightening screw 36 and bracket 38 are not shown.

As shown in FIGS. 3A and 3B, each probe holder assembly, e.g., 42 may swivel around the linear axis of a screw 50 which extends through member 40. This degree of freedom of motion is indicated by the opposing arrows shown in FIG. 3A.

As described for probe holder 20, FIG. 1, probe holder member 40 is connected to clamp 22. Thus, screw knob 30 still provides the functions of tightening clamp 22 around rod 14 and holding clamp 22 and probe holder member 40 together.

Those skilled in the art will understand that four openings are merely exemplary, and that more or fewer may be provided. Similarly, those having skill in the art will appreciate that detailed construction of the clamps is a matter of designer choice.

The important feature of the present invention is that a mechanism holds a probe reliably in a selected position through the interaction of a probe holder with several degrees of movement along and about a rod which is also able to be adjusted in more than one dimension. The probe holding mechanism of the present invention is provided for enabling a single operator to give attention to the positioning of the probe and subsequently to the oscilloscope read out.

The above description of the present invention has focused on its applicability to probing printed circuit boards, but the invention may be used to precisely place and securely hold any tool during manufacture, test or rework of any item requiring precision tool placement.

While the invention has been shown and described with reference to particular embodiments thereof, it will be understood by those skilled in the art that the foregoing and other changes in form and detail may be made therein without departing from the spirit and scope of the invention.

What is claimed is:

1. Apparatus for holding a normally hand held electronic probe at a selected site on a printed circuit board comprising:

a electronic probe holding clamp;

a longitudinally extending arm;

means for selectively positioning and locking said clamp along said arm at any angular location;

a base placeable adjacent said printed circuit board; and means for attaching said arm to said base.

2. The apparatus of claim 1 wherein said means for attaching includes:

means for selectively angularly adjusting said arm relative to said base; and means for locking said arm in a selected angular position.

3. The apparatus of claim 2 wherein at least another of said electronic probe holding clamp is provided to hold at least another electronic probe.

4. The apparatus of claim 2 additionally including:

means for precision adjustment of said longitudinally extending arm.

5. The apparatus of claim 4 wherein said electronic probe holding clamp is made from an electrically non conducting material.

6. A method of facilitating manual electronic testing of sites on a printed circuit board comprising the steps of:

providing a nonconducting clamp for holding an electronic probe;

selectively positioning said clamp along and around a longitudinally extending arm;

attaching said arm to a base with a swivel clamp and performing gross and fine adjustments in plural dimensions at said base to said arm and clamp holding said electronic probe, whereby said electronic probe is reliably and steadily held until manual repositioning occurs.

* * * * *